(12) United States Patent
Tang et al.

(10) Patent No.: US 10,076,061 B2
(45) Date of Patent: Sep. 11, 2018

(54) MOTOR CONTROLLER AND FAN SYSTEM COMPRISING THE SAME

(71) Applicant: Zhongshan Broad-Ocean Motor Co., Ltd., Zhongshan (CN)

(72) Inventors: Songfa Tang, Zhongshan (CN); Chongsheng Zeng, Zhongshan (CN); Jianlong Feng, Zhongshan (CN); Zhongying Ji, Zhongshan (CN); Youping Mei, Zhongshan (CN)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 0 days.

(21) Appl. No.: 15/693,422

(22) Filed: Aug. 31, 2017

(65) Prior Publication Data

US 2017/0367220 A1    Dec. 21, 2017

Related U.S. Application Data

(60) Division of application No. 14/565,363, filed on Dec. 9, 2014, now Pat. No. 9,788,458, which is a continuation-in-part of application No. PCT/CN2013/085760, filed on Oct. 23, 2013.

(30) Foreign Application Priority Data

Jun. 29, 2013    (CN) ..................... 2013 2 0387505 U

(51) Int. Cl.
| | | |
|---|---|---|
| *H05K 7/20* | (2006.01) | |
| *F04D 29/58* | (2006.01) | |
| *F04D 25/06* | (2006.01) | |
| *F04D 27/00* | (2006.01) | |
| *H05K 5/02* | (2006.01) | |
| *H05K 5/00* | (2006.01) | |

(52) U.S. Cl.
CPC ......... *H05K 7/20418* (2013.01); *F04D 25/06* (2013.01); *F04D 25/068* (2013.01); *F04D 27/00* (2013.01); *F04D 27/004* (2013.01); *F04D 29/5813* (2013.01); *H05K 5/0234* (2013.01); *H05K 5/0026* (2013.01)

(58) Field of Classification Search
CPC ............... H05K 7/20418; H05K 7/209; H05K 7/20409; H05K 5/0026; H05K 5/0239; H05K 5/0234; F04D 25/068; F04D 25/06; F04D 27/00; F04D 27/004; F04D 29/5813; H02K 9/00; H02K 5/00; H02K 11/33
USPC ................ 361/703, 704; 417/423.14; 310/62
See application file for complete search history.

(56) References Cited

U.S. PATENT DOCUMENTS

| | | | | |
|---|---|---|---|---|
| 6,364,004 B1 * | 4/2002 | Ehrmann | ............ | F04D 25/0606 123/41.31 |
| 2004/0145324 A1 * | 7/2004 | Ross | .................. | B60H 1/00428 318/400.08 |

(Continued)

*Primary Examiner* — Nathan Zollinger
(74) *Attorney, Agent, or Firm* — Matthias Scholl, PC; Matthias Scholl

(57) ABSTRACT

A fan system including a volute, a wind wheel, a motor, and a motor controller. The motor controller includes a control box including a plurality of fins for dissipating heat of the motor controller, and controls the operation of the motor to drive the wind wheel. The wind wheel is adapted to suck ambient air to form an air flow which passes through the plurality of fins.

11 Claims, 8 Drawing Sheets

(56) References Cited

U.S. PATENT DOCUMENTS

2006/0066155 A1* 3/2006 Matin .................... H02K 5/136
                                                                     310/52
2008/0044298 A1* 2/2008 Laski ..................... F04B 17/03
                                                                     417/312

* cited by examiner

MOTOR CONTROLLER AND FAN SYSTEM COMPRISING THE SAME

CROSS-REFERENCE TO RELATED APPLICATIONS

This application is a divisional of U.S. patent application Ser. No. 14/565,363, filed Dec. 9, 2014, now pending, which is a continuation-in-part of International Patent Application No. PCT/CN2013/085760 with an international filing date of Oct. 23, 2013, designating the United States, and further claims foreign priority to Chinese Patent Application No. 201320387505.9 filed Jun. 29, 2013. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

Field of the Invention

The invention relates to a motor controller and a fan system comprising the same.

Description of the Related Art

A typical motor controller includes a control box and a control circuit board. The control box is provided with a cavity, and the control circuit board is disposed in the cavity of the control box. The motor controller is generally disposed at a bottom part of a load box. Limited by the space, the motor controller generally has a small volume, thereby resulting in poor heat dissipation performance; besides, heat quantity produced by the motor is accumulated at the bottom part of the load box. Because the control circuit board is mounted inside the sealed control box, when the temperature therein increases and the heat quantity in the control box is difficult to dissipate, the normal operation of the control circuit board will be seriously affected. Thus, the motor controller of such structure has low reliability and hidden dangers. Some manufacturers have adopted methods of arranging cooling ribs or vent holes on an outer surface of the control box to improve the heat dissipation performance of the motor controller, but such motor controller is troublesome in assembly and the heat dissipation effect thereof is not ideal.

A typical fan system includes a volute, a wind wheel, a motor, and a motor controller. The volute is provided with an inner cavity. An end face of the volute is provided with an air inlet, and a side face of the volute is provided with an air outlet. The motor is disposed outside the air inlet of the volute; a rotating shaft of the motor is inserted into the inner cavity from the air inlet and connected to the wind wheel; and the motor controller is generally disposed away of the motor. Since the motor is far away from the motor controller, a lead wire demanded for connection is so long that a large space is occupied; furthermore, it is troublesome to connect the long lead wire, faults easily occur, and hidden dangers exist. In some existing motors, the motor controller is disposed near the motor. However, since the motor controller is a sealed structure, poor dissipation performance of the motor controller is resulted. After a long term operation of the motor controller, the temperature inside the motor controller increases, so that the normal operation of the motor controller is affected, and faults easily occur during the operation of the motor under the control of the motor, thereby resulting in low reliability.

SUMMARY OF THE INVENTION

In view of the above-described problems, it is one objective of the invention to provide a motor controller and a fan system comprising the same. The motor controller has a simple structure, convenient installation, excellent heat dissipation performance, high efficiency and reliability. The fan system has a simple and compact structure, convenient installation, good heat dissipation performance, and high reliability.

To achieve the above objective, in accordance with one embodiment of the invention, there is provided a motor controller. The motor controller comprises: a supporting frame, a control circuit board, and a control box. The control box comprises: a cavity, a base plate, and a plurality of fins for dissipating heat generated in the motor controller. The control circuit board is disposed on the base plate in the cavity. The fins are disposed outside the cavity on an outer side surface of the base plate. Cooling ducts are formed between adjacent fins. The control box is fixed on the supporting frame.

In a class of this embodiment, the control box comprises: the base plate, an upper plate, and a lower plate. The upper plate and the lower plate are extended from two ends of the base plate to a same side. The upper plate, the base plate, and the lower plate form the cavity, side openings at two sides of the cavity, and an upper opening at a top of the cavity. The supporting frame comprises two supporting plates and a connecting plate connected to the two supporting plates. The connecting plate shields the upper opening of the control box. The supporting plates shield the side openings at two sides of the control box and match with two side surfaces of the base plate, respectively, for mounting the control box on the supporting frame.

In a class of this embodiment, the supporting frame comprises a plurality of vent holes and a gel inlet. An encapsulating material is filled into the control box via the gel inlet for partially or totally covering the control circuit board.

In a class of this embodiment, the two supporting plates lock the control box on an upper part of the supporting frame via screws.

In a class of this embodiment, steps are arranged in the cavity on the upper plate and the lower plate. The control circuit board is disposed on top surfaces of the steps. A plurality of mounting columns is disposed on the base plate in the cavity. The control circuit board is fixed on top surfaces of the mounting columns via screws.

In a class of this embodiment, a plurality of wire bushings is disposed on the lower plate of the control box. Lead wires of the control circuit board are led out from the wire bushings. A bottom part of each of the two supporting plates is bent to form a flange. A plurality of mounting holes is disposed on the flange.

In accordance with another embodiment of the invention, there is provided a fan system. The fan system comprises: a volute, a wind wheel, a motor, and a motor controller. The volute comprises: an inner cavity, an air inlet, and a first air outlet. The motor comprises a rotating shaft. The motor controller comprises: the supporting frame, the control circuit board, and the control box. The control box comprises: the cavity and the base plate, and a plurality of the fins. The inner cavity is disposed inside the volute. The air inlet is disposed on an end face of the volute. The first air outlet is disposed on a side face of the volute. The motor is disposed outside the air inlet of the volute. The rotating shaft of the motor is inserted into the inner cavity and connected to the wind wheel. The motor controller is disposed nearby the motor. The motor controller is in electric connection with the motor and controls operation of the motor. The control circuit board is disposed on the base plate in the cavity. The fins are disposed outside the cavity on the outer side surface of the base plate. Cooling ducts are formed between adjacent fins. The control box is fixed on the supporting frame.

In a class of this embodiment, the control box comprises: the base plate, an upper plate, and a lower plate. The upper plate and the lower plate are extended from two ends of the base plate to a same side. The upper plate, the base plate, and the lower plate form the cavity, side openings at two sides of the cavity, and an upper opening at a top of the cavity. The supporting frame comprises two supporting plates and a connecting plate connected to the two supporting plates. The connecting plate shields the upper opening of the control box. The supporting plates shield the side openings at two sides of the control box and match with two side faces of the base plate of the control box for mounting the control box on the supporting frame.

In a class of this embodiment, the volute, the motor, and the motor controller are disposed in a mounting cavity of a load box. A second air outlet is disposed on a sidewall of the mounting cavity. The first air outlet of the volute communicates with the second air outlet of the load box.

In a class of this embodiment, the motor is disposed on a motor bracket. A base wall of the load box is provided with a mounting bracket. The motor bracket is disposed on the mounting bracket.

Advantages according to embodiments of the invention are summarized as follows:

1) The control circuit board is disposed on the base plate in the cavity. The fins are disposed outside the cavity on the outer side surface of the base plate. Cooling ducts are formed between adjacent fins. The structure is simple, the volume of the motor controller is enlarged, and the heat dissipation performance and the reliability of the motor controller are improved. The control box is fixed by the supporting frame, and the installation thereof is simple and convenient.

2) The upper plate, the base plate, and the lower plate form the cavity, side openings at the two sides of the cavity, and the upper opening at the top of the cavity. The supporting frame comprises two supporting plates and the connecting plate connected to the two supporting plates. The connecting plate shields the upper opening of the control box. The supporting plates shield the side openings at two sides of the control box and match with two side faces of the base plate of the control box, respectively, for mounting the control box on the supporting frame. The structure is simple, the installation of the control box and the supporting frame is very convenient, and meanwhile, materials for producing the control box are reduced, thereby lowering the production cost.

3) The supporting frame is provided with a plurality of the vent holes. More cooling air flows into the control box to carry out the heat quantity produced by the control circuit board, so that the temperature of the control circuit board is decreased, the control circuit board is ensured to work at a proper ambient temperature, and the reliability of the operation of the motor controller is improved. The encapsulating material is filled into the control box via the gel inlet to partially or totally cover the control circuit board. The structure is simple and is configured to effectively protect the electronic components on the control circuit board and to prevent the electronic components from being polluted or damaged.

4) The two supporting plates lock the control box on the upper part of the supporting frame via screws, and contact area between the fins of the control box and the air outside is enlarged. As more heat quantity of the motor controller is carried out by the air, the heat dissipation performance of the motor controller is improved.

5) Steps are arranged in the cavity on the upper plate and the lower plate. The control circuit board is disposed on top surfaces of the steps. A plurality of mounting columns is disposed on the base plate in the cavity. The control circuit board is fixed on top surfaces of the mounting columns via screws. The structure is simple, and the installation of the control circuit board is simple and convenient.

6) A bottom part of each of the two supporting plates is bent to form a flange. A plurality of mounting holes is disposed on the flange. The motor controller is mounted on other loads via mounting holes of the flanges, thereby realizing simple structure and convenient and firm installation.

7) The motor is disposed outside the air inlet of the volute. The rotating shaft of the motor is inserted into the inner cavity and connected to the wind wheel. The motor controller is disposed nearby the motor. The connection is simple and convenient, less lead wires are demanded, so that the production cost is lowered and the connection is not prone to failure. The motor controller comprises: the supporting frame, the control circuit board, and the control box. The control circuit board is disposed on the base plate in the cavity. The fins are disposed outside the cavity on the outer side surface of the base plate. Cooling ducts are formed between adjacent fins. When the motor works, the wind wheel rotates to suck the air from the mounting cavity of the load box into the air inlet so as to form an air flow, the fins of the motor controller are disposed in the air flow. Heat quantity produced in the operation of the motor controller is carried away by the air flow. Thus, the structure is simple, the heat dissipation performance is excellent, and the reliability of the operation of the motor controller is improved.

8) The motor is disposed on the motor bracket. The base wall of the load box is provided with the mounting bracket. The motor bracket is disposed on the mounting bracket. The structure is simple and the installation is convenient and firm.

BRIEF DESCRIPTION OF THE DRAWINGS

The invention is described hereinbelow with reference to the accompanying drawings, in which.

DETAILED DESCRIPTION OF THE EMBODIMENTS

Figure 1:
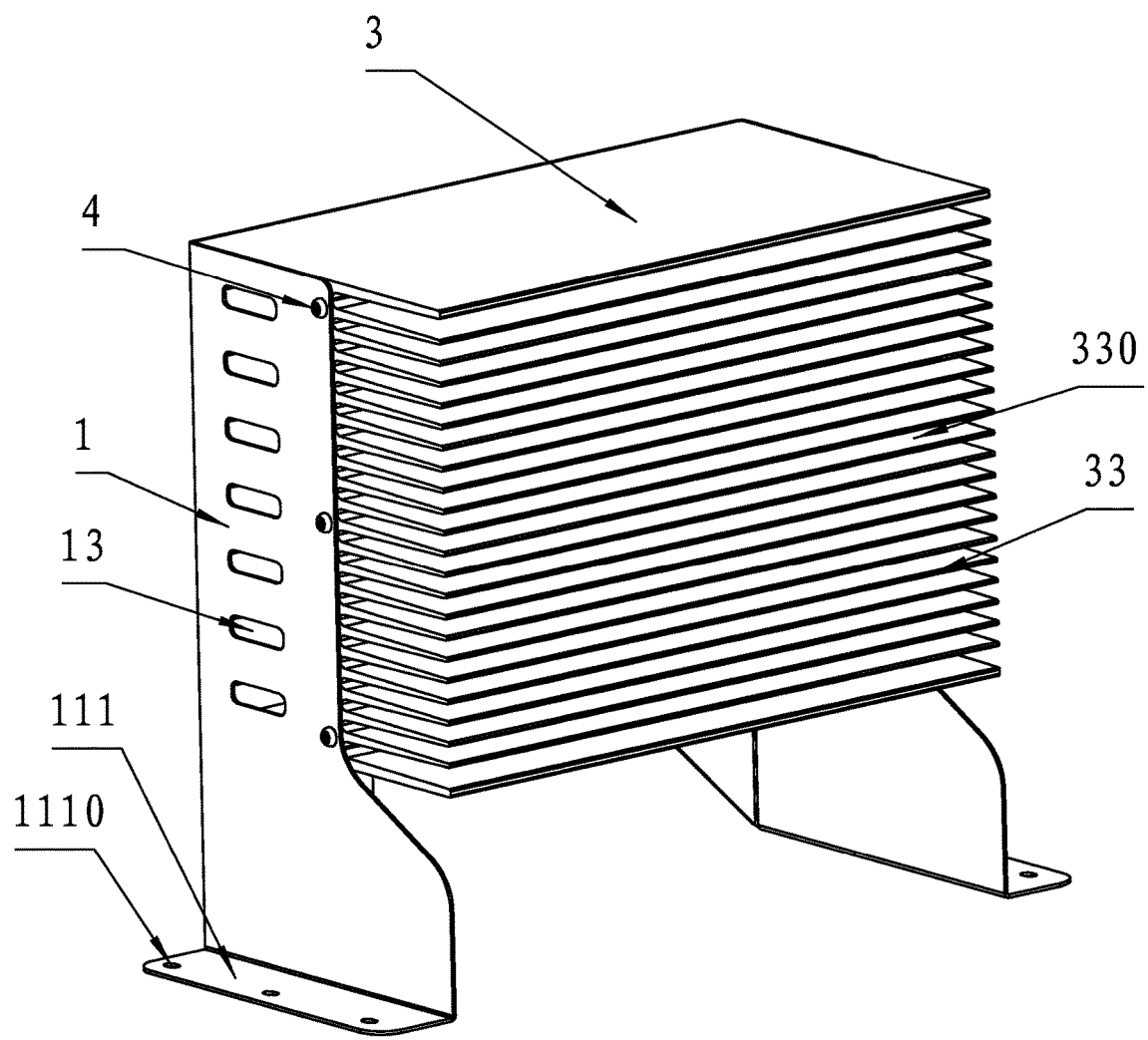
FIG. 1 is a stereogram of a motor controller from one perspective in accordance with one embodiment of the invention.
Figure 2:
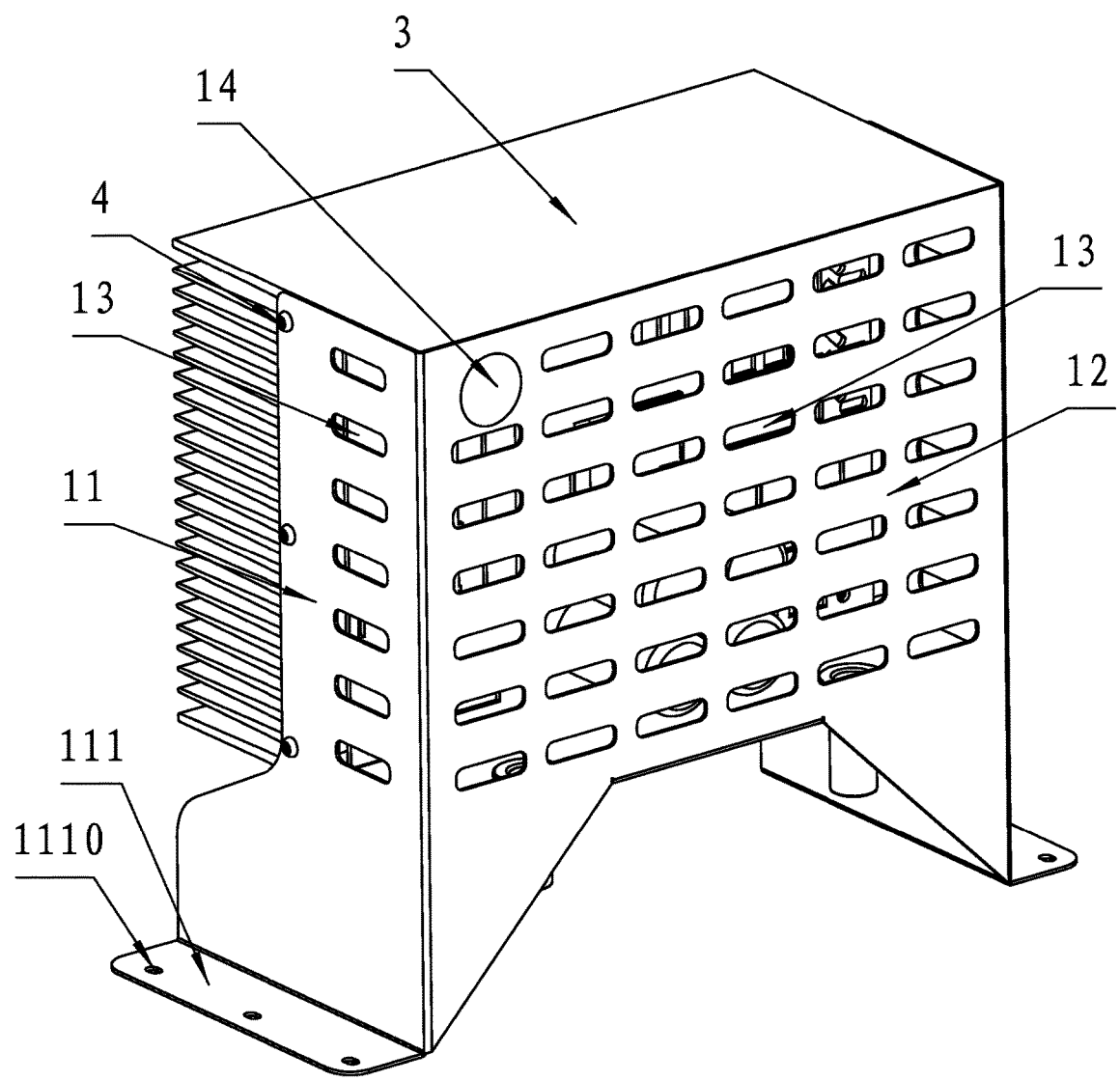
FIG. 2 is a stereogram of a motor controller from another perspective in accordance with one embodiment of the invention.
Figure 3:
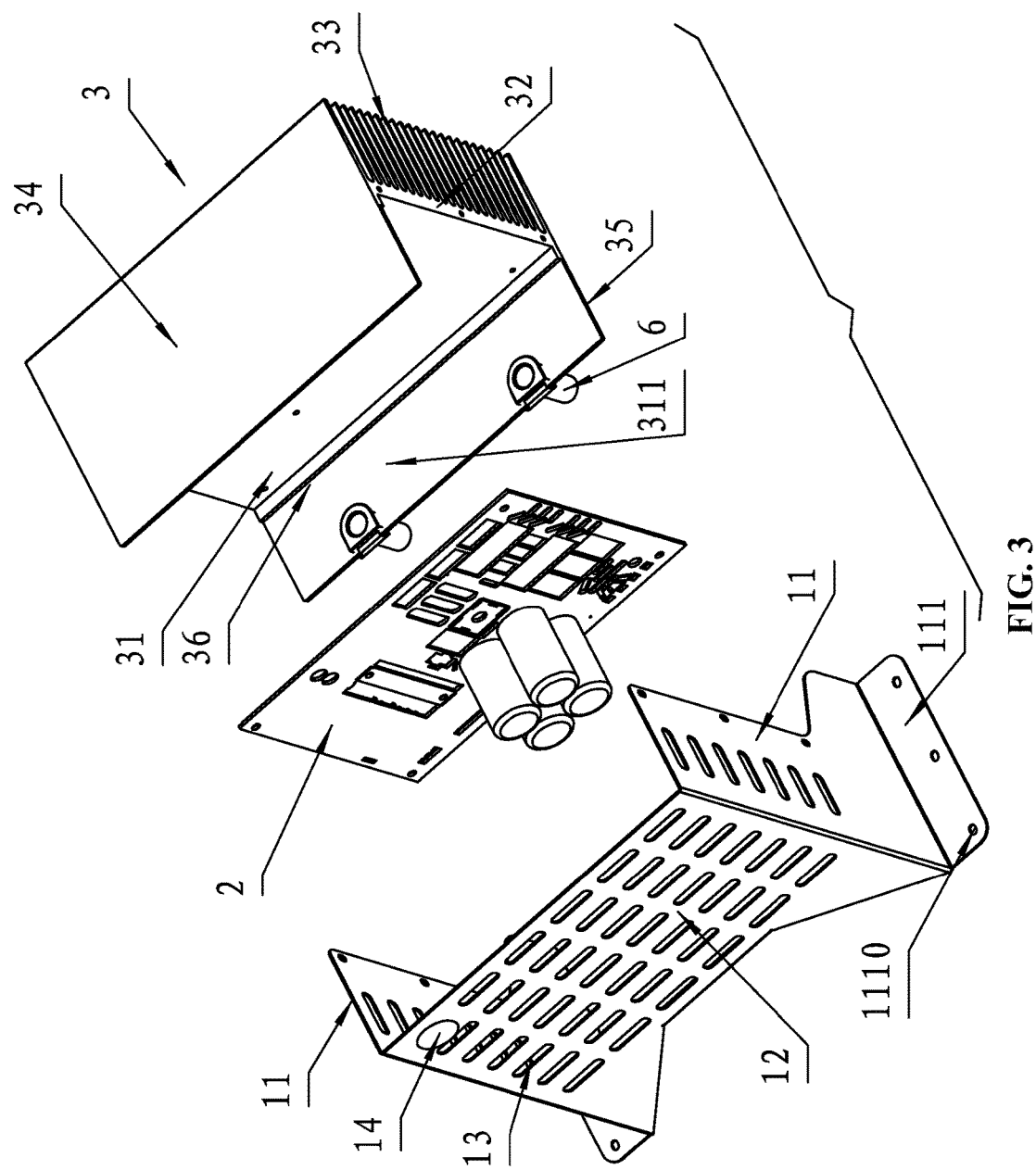
FIG. 3 is an exploded view of a motor controller in accordance with one embodiment of the invention.
Figure 4:
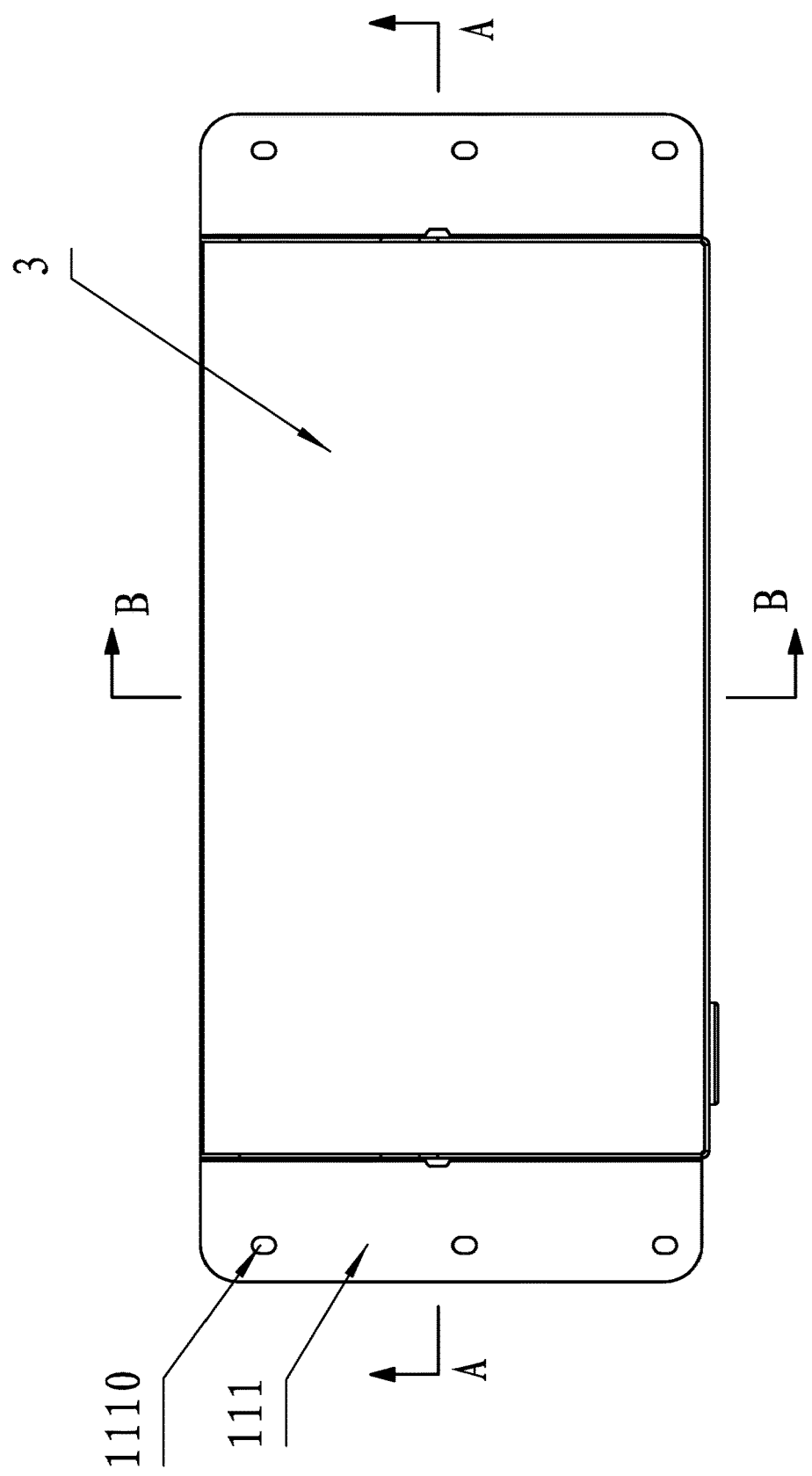
FIG. 4 is a top view of a motor controller in accordance with one embodiment of the invention.
Figure 5:
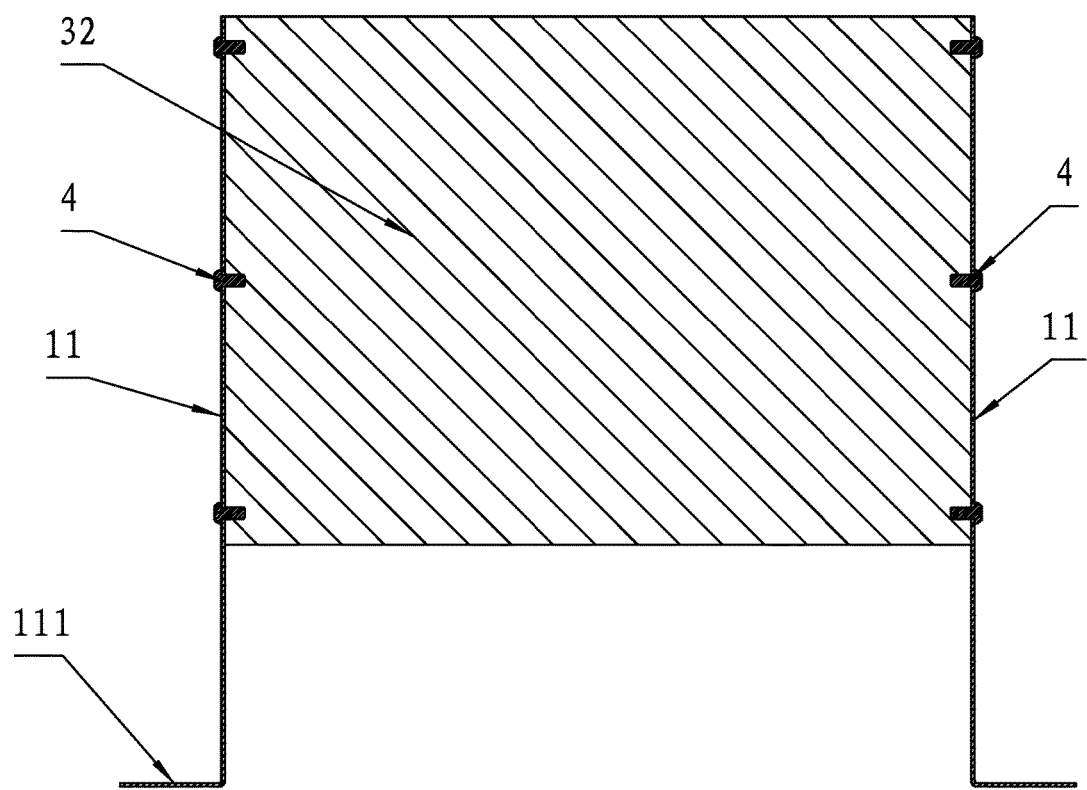
FIG. 5 is a cross sectional view taken from line A-A of FIG. 4.
Figure 6:
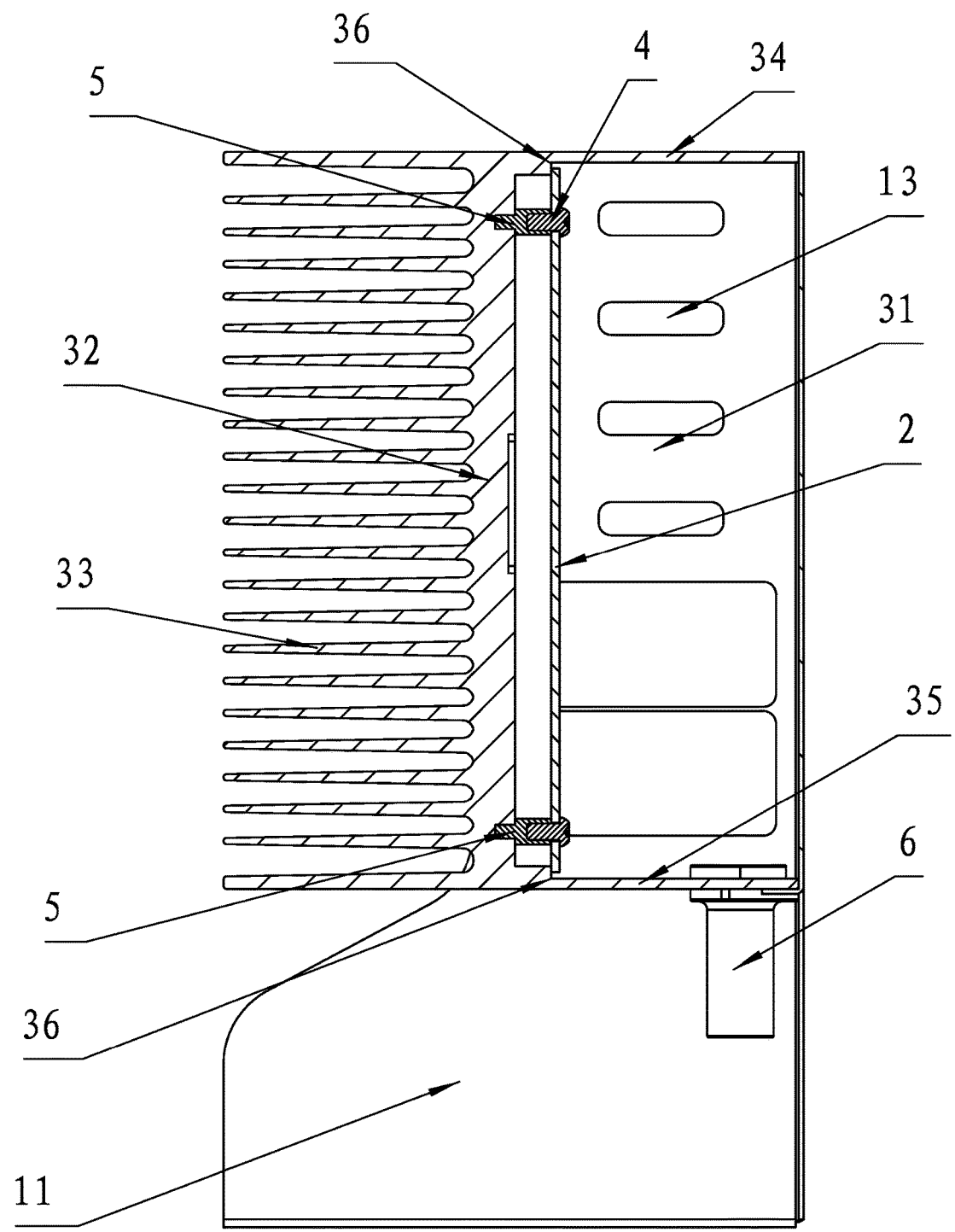
FIG. 6 is cross sectional view taken from line B-B of FIG. 4.

For further illustrating the invention, experiments detailing a motor controller and a fan system comprising the same are described below. It should be noted that the following examples are intended to describe and not to limit the invention.

EXAMPLE 1

As shown in FIGS. 1-6, a motor controller comprises: a supporting frame 1, a control circuit board 2, and a control box 3. The control box 3 is provided with a cavity 31. The control circuit board 2 is disposed on a base plate 32 in the cavity 31. A plurality of fins 33 is disposed outside the cavity 31 on an outer side surface of the base plate 32. Cooling ducts 330 are formed between adjacent fins 33. The control box 3 is fixed on the supporting frame 1.

The control box 3 comprises: the base plate 32, and an upper plate 34 and a lower plate 35 extended from two ends of the base plate 32 to a same side. The upper plate 34, the base plate 32, and the lower plate 35 form the cavity 31, side openings at two sides of the cavity 31, and an upper opening 31 at a top of the cavity 31. The supporting frame 1 comprises two supporting plates 11 and a connecting plate 12 connected to the two supporting plates 11. The connecting plate 12 shields the upper opening 31 of the control box 3. The supporting plates 11 shield the side openings at two sides of the control box 3 and match with two side faces of the base plate 32 of the control box 3, respectively, for mounting the control box 3 on the supporting frame 1.

The supporting frame 1 is provided with a plurality of vent holes 13. The supporting frame 1 is also provided with a gel inlet 14. An encapsulating material is filled into the control box via the gel inlet 14 for partially or totally covering the control circuit board 2.

The two supporting plates 11 lock the control box 3 on an upper part of the supporting frame 1 via screws 4.

Steps 36 are arranged in the cavity 31 on the upper plate 34 and the lower plate 35. The control circuit board 2 is disposed on top surfaces of the steps 36. A plurality of mounting columns 5 is disposed on the base plate 32 in the cavity 31. The control circuit board 2 is fixed on top surfaces of the mounting columns 5 via screws 4.

A plurality of wire bushings 6 is disposed on the lower plate 35 of the control box 3. Lead wires of the control circuit board 2 are led out from the wire bushings 6. A bottom part of each of the two supporting plates 11 is bent to form a flange 111. A plurality of mounting holes 1110 is disposed on the flange 111.

The control box 3 is made of aluminum, and a surface of the supporting frame 1 is coated with white zinc.

Working principle of the motor controller is as follows: the control circuit board 2 is disposed on the base plate 32 in the cavity 31 of the control box 3. The connecting plate 12 shields the upper opening 31 of the control box 3. The supporting plates 11 shield the side openings at two sides of the control box 3 and match with two side faces of the base plate 32 of the control box 3, respectively, for mounting the control box 3 on the supporting frame 1. Heat dissipation of the control box 3 is realized by arranging the fins 33 on the base plate 31 and by arranging the vent holes 13 on the supporting frame 1. The structure is simple and convenient, and the motor controller has good heat dissipation performance and high efficiency and reliability.

EXAMPLE 2

Figure 7:
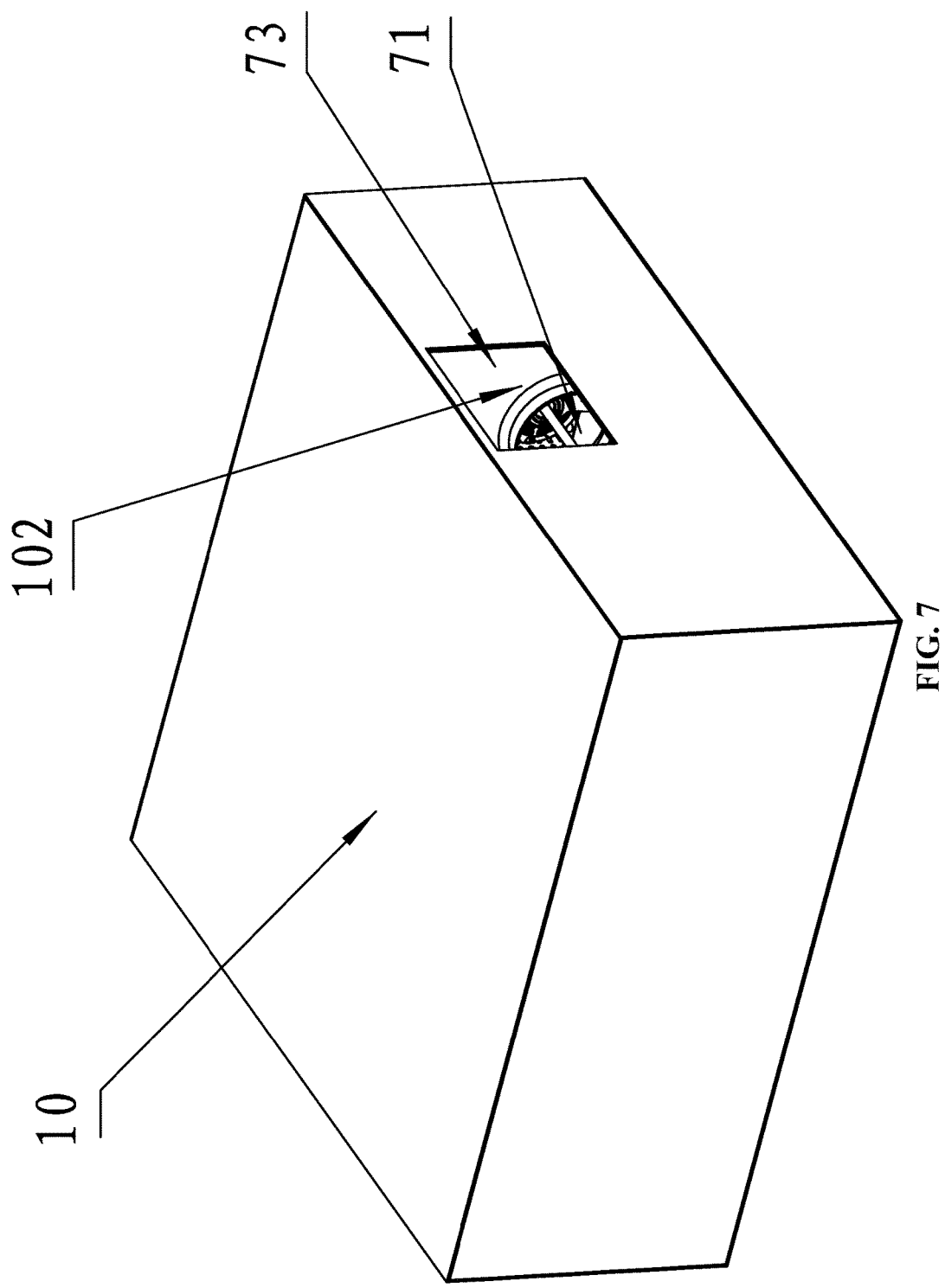
FIG. 7 is a stereogram of a fan system in accordance with one embodiment of the invention.
Figure 8:
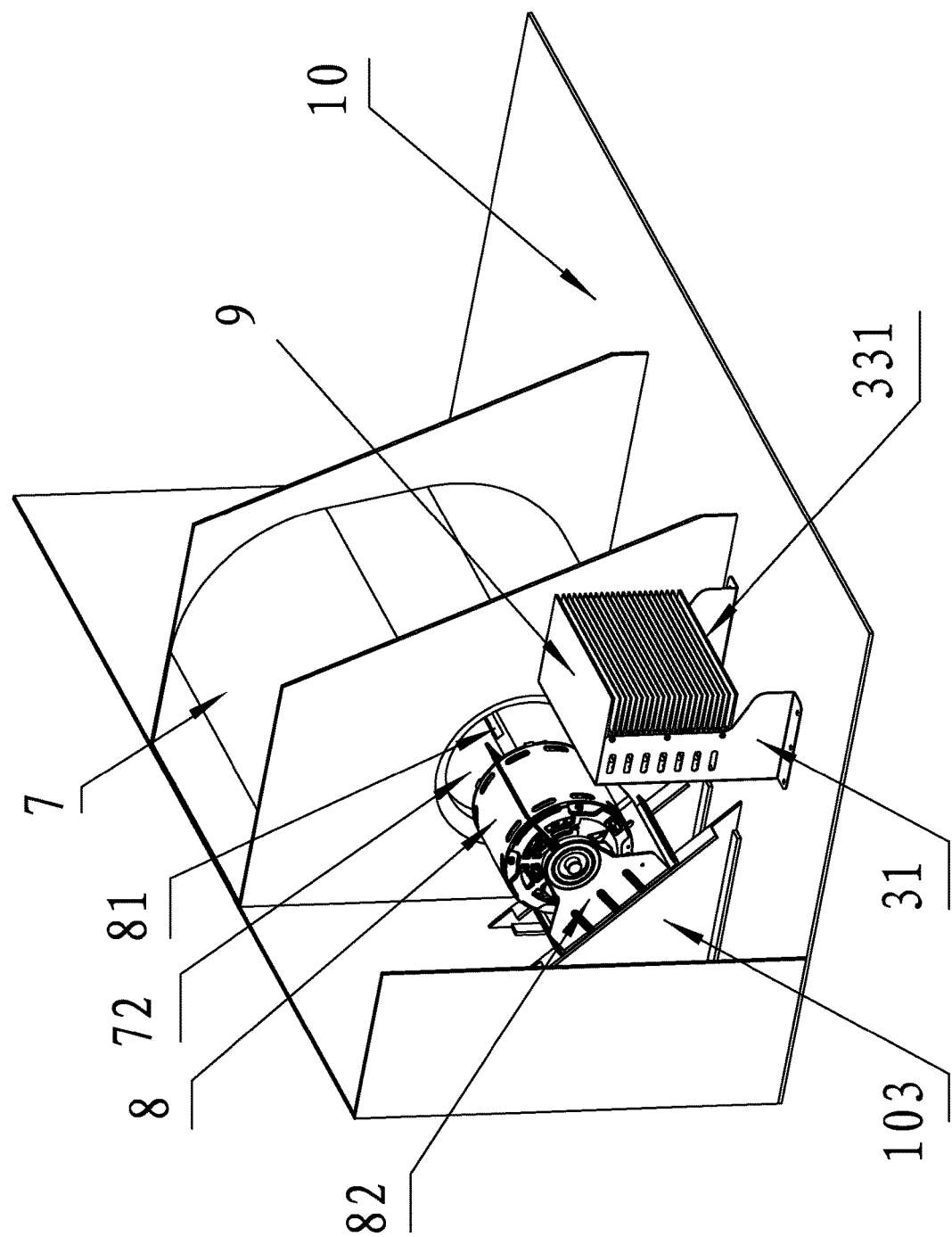
FIG. 8 is a partial assembly diagram of a fan system in accordance with one embodiment of the invention.

As shown in FIGS. 7-8, a fan system comprises: a volute 7, a wind wheel, a motor 8, and a motor controller 9. An inner cavity 71 is disposed in the volute 7. An end face of the volute 7 is provided with an air inlet 72. A side face of the volute 7 is provided with a first air outlet 73. The motor 8 is disposed outside the air inlet 72 of the volute 7. A rotating shaft 81 of the motor 8 is inserted into the inner cavity 71 and connected to the wind wheel. The motor controller 9 is disposed nearby the motor 8. The motor controller 9 is in electric connection with the motor 8 and controls operation of the motor 8. The motor controller 9 comprises: a supporting frame 1, a control circuit board 2, and a control box 3. The control box 3 is provided with a cavity 31. The control circuit board 2 is disposed on a base plate 32 in the cavity 31. A plurality of fins is disposed outside the cavity 31 on an outer side surface of the base plate 32. Cooling ducts 330 are formed between adjacent fins 33. The control box 3 is fixed on the supporting frame 1.

The control box 3 comprises: the base plate 32, and an upper plate 34 and a lower plate 35 extended from two ends of the base plate 32 to a same side. The upper plate 34, the base plate 32, and the lower plate 35 form the cavity 31, side openings at two sides of the cavity 31, and an upper opening 31 at a top of the cavity 31. The supporting frame 1 comprises two supporting plates 11 and a connecting plate 12 connected to the two supporting plates 11. The connecting plate 12 shields the upper opening 31 of the control box 3. The supporting plates 11 shield the side openings at two sides of the control box 3 and match with two side faces of the base plate 32 of the control box 3, respectively, for mounting the control box 3 on the supporting frame 1.

The volute 7, the motor 8, and the motor controller 9 are disposed in a mounting cavity of a load box 10. A second air outlet 102 is disposed on a sidewall of the mounting cavity. The first air outlet 73 of the volute 7 communicates with the second air outlet 102 of the load box 10.

The motor 8 is disposed on a motor bracket 82. A base wall of the load box 10 is provided with a mounting bracket 103. The motor bracket 82 is disposed on the mounting bracket 103.

Principle of the above fan system is as follows: the motor 8 is disposed outside the air inlet 72 of the volute 7. The rotating shaft 81 of the motor 8 is inserted into the inner cavity 71 and connected to the wind wheel. The motor controller 9 is disposed nearby the motor 8. The fins are disposed outside the cavity on the outer side surface of the base plate 32. The fins 33 are adapted to dissipate heat of the motor controller. Cooling ducts 330 are formed between adjacent fins 33. When the motor works, the wind wheel rotates to suck the air from the mounting cavity of the load box into the air inlet so as to form an air flow, the fins of the motor controller are disposed in the air flow. Heat quantity produced in the operation of the motor controller is carried away by the air flow. Thus, the structure is simple, the heat dissipation performance is excellent, and the reliability of the operation of the motor controller is improved.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A fan system, comprising:
   a) a volute, the volute comprising an inner cavity, an air inlet, and a first air outlet;
   b) an impeller wheel;
   c) a motor, the motor comprising a rotating shaft; and
   d) a motor controller, the motor controller comprising a control box, a control circuit board, and a supporting frame; the control box comprising a plurality of fins, a cavity, a base plate, a plurality of cooling ducts, an upper plate, and a lower plate; and the supporting frame comprising two supporting plates and a connecting plate;

wherein:
   the inner cavity is disposed within the volute;
   the impeller wheel is disposed within the inner cavity;
   the air inlet and the first air outlet are disposed on sidewalls of the volute;
   the motor is disposed outside the volute;
   the rotating shaft extends into the inner cavity and is connected to the impeller wheel;
   the motor controller is disposed nearby the motor;
   the motor controller is in electric connection with the motor and controls the operation of the motor;
   the plurality of fins is adapted to dissipate heat of the motor controller;
   the impeller wheel is adapted to suck ambient air to form an air flow wherein the air flow passes through the plurality of fins;
   the control circuit board is disposed on the base plate and in the cavity;
   the plurality of fins is disposed outside the cavity on an outer side surface of the base plate;
   each of the plurality of cooling ducts is formed between two adjacent fins;
   the upper plate and the lower plate respectively extend from two ends of the base plate to the same side;
   the upper plate, the base plate, and the lower plate form the cavity, two side openings respectively at two sides of the cavity, and an upper opening at a top of the cavity;
   the two supporting plates respectively extend from two ends of the connecting plate to the same side;
   the connecting plate shields the upper opening of the control box; and
   the two supporting plates respectively shield the two side openings at two sides of the control box and match with two side faces of the base plate of the control box for mounting the control box on the supporting frame.

2. The fan system of claim 1, wherein:
   the supporting frame further comprises a plurality of vent holes and a gel inlet; and
   the control box is filled with an encapsulating material via the gel inlet for partially or totally covering the control circuit board.

3. The fan system of claim 1, wherein the two supporting plates lock the control box on an upper part of the supporting frame via screws.

4. The fan system of claim 1, wherein:
   a plurality of steps is arranged in the cavity on the upper plate and the lower plate;
   the control circuit board is disposed on top surfaces of the plurality of steps;
   a plurality of mounting columns is disposed on the base plate in the cavity; and
   the control circuit board is fixed on top surfaces of the plurality of mounting columns.

5. The fan system of claim 1, wherein:
   a plurality of wire bushings is disposed on the lower plate;
   lead wires of the control circuit board are led out from the plurality of wire bushings;
   a bottom part of each of the two supporting plates is bent to form a flange; and
   a plurality of mounting holes is disposed on the flange.

6. A fan system, comprising:
   a) a volute, the volute comprising an inner cavity, an air inlet, and a first air outlet;
   b) an impeller wheel;
   c) a motor, the motor comprising a rotating shaft;
   d) a motor controller, the motor controller comprising a control box, a control circuit board, and a supporting frame; the control box comprising a plurality of fins, a cavity, a base plate, a plurality of cooling ducts, an upper plate, and a lower plate; and the supporting frame comprising two supporting plates and a connecting plate; and
   e) a load box comprising a mounting cavity;

wherein:
   the inner cavity is disposed within the volute;
   the impeller wheel is disposed within the inner cavity;
   the air inlet and the first air outlet are disposed on sidewalls of the volute;
   the motor is disposed outside the volute;
   the rotating shaft extends into the inner cavity and is connected to the impeller wheel;
   the motor controller is disposed nearby the motor;
   the motor controller is in electric connection with the motor and controls the operation of the motor;
   the plurality of fins is adapted to dissipate heat of the motor controller;
   the impeller wheel is adapted to suck ambient air to form an air flow wherein the air flow passes through the plurality of fins;
   the volute, the motor, and the motor controller are disposed within the mounting cavity;
   a second air outlet is disposed on a sidewall of the load box;
   the first air outlet communicates with the second air outlet
   the control circuit board is disposed on the base plate and in the cavity;
   the plurality of fins is disposed outside the cavity on an outer side surface of the base plate;
   each of the plurality of cooling ducts is formed between two adjacent fins;
   the upper plate and the lower plate respectively extend from two ends of the base plate to the same side;
   the upper plate, the base plate, and the lower plate form the cavity, two side openings respectively at two sides of the cavity, and an upper opening at a top of the cavity;
   the two supporting plates respectively extend from two ends of the connecting plate to the same side;
   the connecting plate shields the upper opening of the control box; and
   the two supporting plates respectively shield the two side openings at two sides of the control box and match with two side faces of the base plate of the control box for mounting the control box on the supporting frame.

7. The fan system of claim 6, wherein:
a mounting bracket is disposed on a base wall of the load box;
a motor bracket is disposed on the mounting bracket; and
the motor is disposed on the motor bracket.

8. The fan system of claim 6, wherein:
the supporting frame comprises a plurality of vent holes and a gel inlet; and
the control box is filled with an encapsulating material via the gel inlet for partially or totally covering the control circuit board.

9. The fan system of claim 6, wherein the two supporting plates lock the control box on an upper part of the supporting frame via screws.

10. The fan system of claim 6, wherein:
a plurality of steps is arranged in the cavity on the upper plate and the lower plate;
the control circuit board is disposed on top surfaces of the plurality of steps;
a plurality of mounting columns is disposed on the base plate in the cavity; and
the control circuit board is fixed on top surfaces of the plurality of mounting columns.

11. The fan system of claim 6, wherein:
a plurality of wire bushings is disposed on the lower plate;
lead wires of the control circuit board are led out from the plurality of wire bushings;
a bottom part of each of the two supporting plates is bent to form a flange; and
a plurality of mounting holes is disposed on the flange.

* * * * *